United States Patent
Lee et al.

(10) Patent No.: US 11,373,792 B2
(45) Date of Patent: Jun. 28, 2022

(54) MAGNETIC CORE, INDUCTOR AND EMI FILTER COMPRISING SAME

(71) Applicant: LG INNOTEK CO., LTD., Seoul (KR)

(72) Inventors: Mi Jin Lee, Seoul (KR); Yu Seon Kim, Seoul (KR); Seok Bae, Seoul (KR); Ji Yeon Song, Seoul (KR); Sang Won Lee, Seoul (KR); Jong Wook Lim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 300 days.

(21) Appl. No.: 16/482,969

(22) PCT Filed: Feb. 13, 2018

(86) PCT No.: PCT/KR2018/001856
§ 371 (c)(1),
(2) Date: Aug. 1, 2019

(87) PCT Pub. No.: WO2018/151491
PCT Pub. Date: Aug. 23, 2018

(65) Prior Publication Data
US 2020/0234866 A1 Jul. 23, 2020

(30) Foreign Application Priority Data
Feb. 14, 2017 (KR) .................. 10-2017-0019999

(51) Int. Cl.
*H01F 17/06* (2006.01)
*H03H 7/01* (2006.01)
(Continued)

(52) U.S. Cl.
CPC ....... *H01F 17/062* (2013.01); *H01F 1/14766* (2013.01); *H01F 1/344* (2013.01); *H03H 7/0115* (2013.01)

(58) Field of Classification Search
CPC .......... H03H 7/09; H03H 7/427; H01F 17/06; H01F 2027/2819; H01F 17/062
(Continued)

(56) References Cited

U.S. PATENT DOCUMENTS

2003/0210123 A1 11/2003 Chu
2006/0125586 A1 6/2006 Lee et al.
(Continued)

FOREIGN PATENT DOCUMENTS

CN 1790563 6/2006
CN 102368424 3/2012
(Continued)

OTHER PUBLICATIONS

International Search Report dated May 18, 2018 issued in Application No. PCT/KR2018/001856.
(Continued)

*Primary Examiner* — Rakesh B Patel
(74) *Attorney, Agent, or Firm* — KED & Associates, LLP

(57) ABSTRACT

An inductor according to one embodiment of the present invention comprised: a magnetic core; and a coil wound around the magnetic core, wherein the magnetic core includes a plurality of stacked sub-magnetic cores, each sub-magnetic core includes a first magnetic body and a second magnetic body, the first magnetic body and the second magnetic core are different materials, the second magnetic body is arranged on a surface of the first magnetic body, each sub-magnetic core has a toroidal shape, and a permeability of the first magnetic body differs from a permeability of the second magnetic body.

20 Claims, 13 Drawing Sheets

(51) Int. Cl.
*H01F 1/147* (2006.01)
*H01F 1/34* (2006.01)

(58) Field of Classification Search
USPC .................................................. 333/181, 185
See application file for complete search history.

(56) References Cited

U.S. PATENT DOCUMENTS

2007/0257759 A1  11/2007  Lee et al.
2008/0037298 A1  2/2008  Lafontaine
2014/0028431 A1  1/2014  Lee et al.
2016/0148748 A1  5/2016  Shen

FOREIGN PATENT DOCUMENTS

| CN | 104620336 | 5/2015 |
| CN | 105321669 | 2/2016 |
| DE | 975437 | 11/1961 |
| EP | 3024002 | 5/2016 |
| JP | H03-150815 | 6/1991 |
| KR | 10-2010-0009381 | 1/2010 |
| KR | 10-2010-0128078 | 12/2010 |
| KR | 10-2012-0114850 | 10/2012 |
| KR | 10-2015-0143251 | 12/2015 |

OTHER PUBLICATIONS

European Search Report dated Feb. 24, 2021 issued in Application No. 18754950.6.
Chinese Office Action dated Dec. 2, 2020 issued in Application No. 201880011852.7.

(a)                      (b)

(A)  (B)

MAGNETIC CORE, INDUCTOR AND EMI FILTER COMPRISING SAME

CROSS-REFERENCE TO RELATED PATENT APPLICATIONS

This application is a U.S. National Stage Application under 35 U.S.C. § 371 of PCT Application No. PCT/KR2018/001856, filed Feb. 13, 2018, which claims priority to Korean Patent Application No. 10-2017-0019999, filed Feb. 14, 2017, whose entire disclosures are hereby incorporated by reference.

TECHNICAL FIELD

The present invention relates to a magnetic core, an inductor, and an electromagnetic interference (EMI) filter including the same.

BACKGROUND ART

An inductor is one of electronic parts applied to a printed circuit board and is applicable to a resonance circuit, a filter circuit, a power circuit, and the like due to its electromagnetic characteristics.

Recently, miniaturization and thinning of various electronic devices such as communication devices and display devices are important issues. Therefore, inductors applied to such electronic devices need to be miniaturized and thinned and to have high efficiency.

Meanwhile, an electromagnetic interference (EMI) filter which is applied to an inside of a power board serves to pass a signal, which is necessary for circuit operation, and remove noise. FIG. 1 is an example of a circuit diagram of an EMI filter. Referring to FIG. 1, an EMI filter 10 may include a plurality of capacitors Cx and Cy and inductors L. Types of noise generated from a power board may be broadly classified into radio noise ranging from 30 MHz to 1 GHz radiated from the power board and conductive noise ranging from 150 kHz to 30 MHz conducted through a power line. Transmission modes of conductive noise may be divided into a differential mode and a common mode. Among them, common mode noise, even a small amount of noise, is reflected back while drawing a large loop and thus can affect electronic devices that are far away. The common mode noise is generated due to impedance imbalance of a wiring system and is significantly generated in a high-frequency environment.

In order to remove the common mode noise, in the inductor applied to the EMI filter, a toroidal magnetic core including a Mn—Zn based ferrite material is generally used. The Mn—Zn based ferrite has a high permeability at a frequency ranging from 100 kHz to 1 MHz and thus is effective for removing the common mode noise. A magnetic core having high inductance is required as power of a power board, to which the EMI filter is applied, increases. To this end, a magnetic core having a high permeability, for example, a magnetic core having a permeability (L) ranging from 10,000 to 15,000, should be used. Since the Mn—Zn based ferrite having such a high permeability has a high unit price and a core loss rate is low due to material characteristics of the Mn—Zn based ferrite, noise removal efficiency in a frequency band ranging from 6 to 30 MHz is still low.

DISCLOSURE

Technical Problem

The present invention is directed to providing a coil part applicable to an electromagnetic interference (EMI) filter.

Technical Solution

One aspect of the present invention provides an inductor including a magnetic core, and a coil wound around the magnetic core, wherein the magnetic core includes a plurality of stacked sub-magnetic cores, each of the sub-magnetic cores includes a first magnetic body and a second magnetic body, the first magnetic body and the second magnetic body are different types of magnetic bodies, the second magnetic body is disposed on at least a portion of a surface of the first magnetic body, each of the sub-magnetic cores has a toroidal shape, and a permeability of the first magnetic body differs from a permeability of the second magnetic body.

A ratio of a thickness of the second magnetic body disposed on an outer circumferential surface of the first magnetic body in a radial direction of the first magnetic body to a thickness of the first magnetic body may range from 1:16 to 1:80.

A ratio of a thickness of the second magnetic body disposed on an inner circumferential surface of the first magnetic body in the radial direction of the first magnetic body to the thickness of the first magnetic body may range from 1:16 to 1:80.

The permeability of the second magnetic body may be greater than the permeability of the first magnetic body.

The first magnetic body may include ferrite and the second magnetic body may include a metal ribbon.

The first magnetic body may include a Mn—Zn based ferrite and the second magnetic body may include an Fe—Si based metal ribbon.

The first magnetic body may have a toroidal shape, and the second magnetic body may be disposed to surround all of an upper surface, an outer circumferential surface, a lower surface, and an inner circumferential surface of the first magnetic body.

The second magnetic body which surrounds at least one of the outer circumferential surface and the inner circumferential surface of the first magnetic body may include a metal ribbon in which a plurality of layers are wound.

The number of layers of the metal ribbon disposed in a region in which the coil is wound may differ from the number of layers of the metal ribbon disposed in a region in which the coil is not wound.

Each of a thickness of the second magnetic body disposed on the upper surface of the first magnetic body and a thickness of the second magnetic body disposed on the lower surface of the first magnetic body may be smaller than a distance between the upper surface of the first magnetic body and the lower surface of the first magnetic body, and each of a thickness of the second magnetic body disposed on the outer circumferential surface of the first magnetic body and a thickness of the second magnetic body disposed on the inner circumferential surface of the first magnetic body may be smaller than a distance between the outer circumferential surface of the first magnetic body and the inner circumferential surface of the first magnetic body.

The magnetic core may have a toroidal shape, the first magnetic body may include a first region in which the second magnetic body is disposed to surround an upper surface, an outer circumferential surface, a lower surface, and an inner circumferential surface of the first magnetic body and a second region in which the second magnetic body is not disposed, and the coil is wound around at least a portion of a surface of the first region.

The second region and the coil may be spaced apart from each other.

The first magnetic body may include a pair of first regions disposed symmetrically to each other and a pair of second regions disposed symmetrically to each other.

The magnetic core may further include a lower sub-magnetic core disposed on a lowermost sub-magnetic core of the plurality of sub-magnetic cores and an upper sub-magnetic core disposed on an uppermost sub-magnetic core of the plurality of sub-magnetic cores. The lower sub-magnetic core and the upper sub-magnetic core may be made of a first magnetic body.

Another aspect of the present invention provides a magnetic core including a first sub-magnetic core and a second sub-magnetic core stacked on the first sub-magnetic core, wherein each of the first sub-magnetic core and the second sub-magnetic core includes a first magnetic body and a second magnetic body, the first magnetic body and the second magnetic body are different types of magnetic bodies, the second magnetic body is disposed on at least a portion of a surface of the first magnetic body, each of the first sub-magnetic core and the second sub-magnetic core has a toroidal shape, and a permeability of the first magnetic body differs from a permeability of the second magnetic body.

The first magnetic body may have a toroidal shape, and the second magnetic body may be disposed to surround all of an upper surface, an outer circumferential surface, a lower surface, and an inner circumferential surface of the first magnetic body.

The second magnetic body which surrounds at least one of the outer circumferential surface and the inner circumferential surface of the first magnetic body may include a metal ribbon in which a plurality of layers are wound.

The first magnetic body may have a toroidal shape, and the first magnetic body may include a first region in which the second magnetic body is disposed to surround the upper surface, the outer circumferential surface, the lower surface, and the inner circumferential surface of the first magnetic body and a second region in which the second magnetic body is not disposed.

The magnetic core may further include a lower sub-magnetic core disposed below the first sub-magnetic core and an upper sub-magnetic core disposed above the second sub-magnetic core, and the lower sub-magnetic core and the upper sub-magnetic core are made of a first magnetic body.

Still another aspect of the present invention provides an EMI filter including at least one inductor and at least one capacitor, wherein the inductor includes a magnetic core and a coil wound around the magnetic core, the magnetic core includes a plurality of stacked sub-magnetic cores, each of the sub-magnetic cores includes a first magnetic body and a second magnetic body, the first magnetic body and the second magnetic body are different types of magnetic bodies, the second magnetic body is disposed on at least a portion of a surface of the first magnetic body, each of the sub-magnetic cores has a toroidal shape, and a permeability of the first magnetic body differs from a permeability of the second magnetic body.

Advantageous Effects

According to embodiments of the present invention, an electromagnetic interference (EMI) filter having high noise removal performance in a wide frequency band, a small size, and a large power capacity can be obtained. Specifically, EMI filters according to the embodiments of the present invention can have high removal performance with respect to both of common mode noise and differential mode noise among conductive noise. In addition, according to the embodiments of the present invention, EMI filters of which noise removal performance is adjustable for each frequency band can be obtained.

MODES OF THE INVENTION

Figure 1:
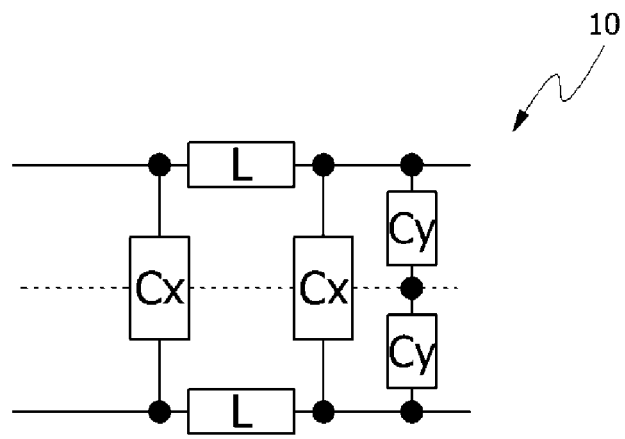
FIG. 1 is an example of a circuit diagram of an electromagnetic interference (EMI) filter.

While the present invention is susceptible to various modifications and alternative forms, specific embodiments thereof are shown by way of example in the drawings and will herein be described in detail. However, it should be understood that there is no intent to limit the present invention to the particular forms disclosed, and on the contrary, the present invention is to cover all modifications, equivalents, and alternatives falling within the spirit and scope of the present invention.

It should be understood that, although the terms "first," "second," etc. may be used herein to describe various elements, these elements are not to be limited by these terms. These terms are only used to distinguish one element from another. For example, a first element could be termed a second element, and, similarly, a second element could be termed a first element, without departing from the scope of the present invention. As used herein, the term "and/or" includes any one or all combinations of a plurality of the associated listed items.

It will be understood that when an element is referred to as being "connected" or "coupled" to another element, it can be directly connected or coupled to another element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

In describing embodiments, when a layer (film), a region, a pattern, or a structure is formed "on" or "under" another substrate, another layer, another pad, or another pattern, it may be directly formed thereon or be formed thereon with still another layer interposed therebetween. The criteria for on/above or below/under of each layer are described with reference to the drawings. In addition, the thickness or size of each layer (film), region, pattern or structure in the drawings may be modified for clarity and convenience of explanation, and thus it does not entirely reflect the actual size.

The terminology used herein is for the purpose of describing particular embodiments only and is not intended to be limiting of the present invention. As used herein, the singular forms "a" and "an" are intended to include the plural forms as well unless the context clearly indicates otherwise. It should be further understood that the terms "comprise," "comprising," "include," and/or "including," when used herein, specify the presence of stated features, integers, steps, operations, elements, parts, and/or combinations thereof, but do not preclude the presence or addition of one or more other features, integers, steps, operations, elements, parts, and/or combinations thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described in detail with reference to the accompanying drawings, the same or corresponding components are denoted by the same reference numerals regardless of reference numbers, and thus the description thereof will not be repeated.

Figure 2:
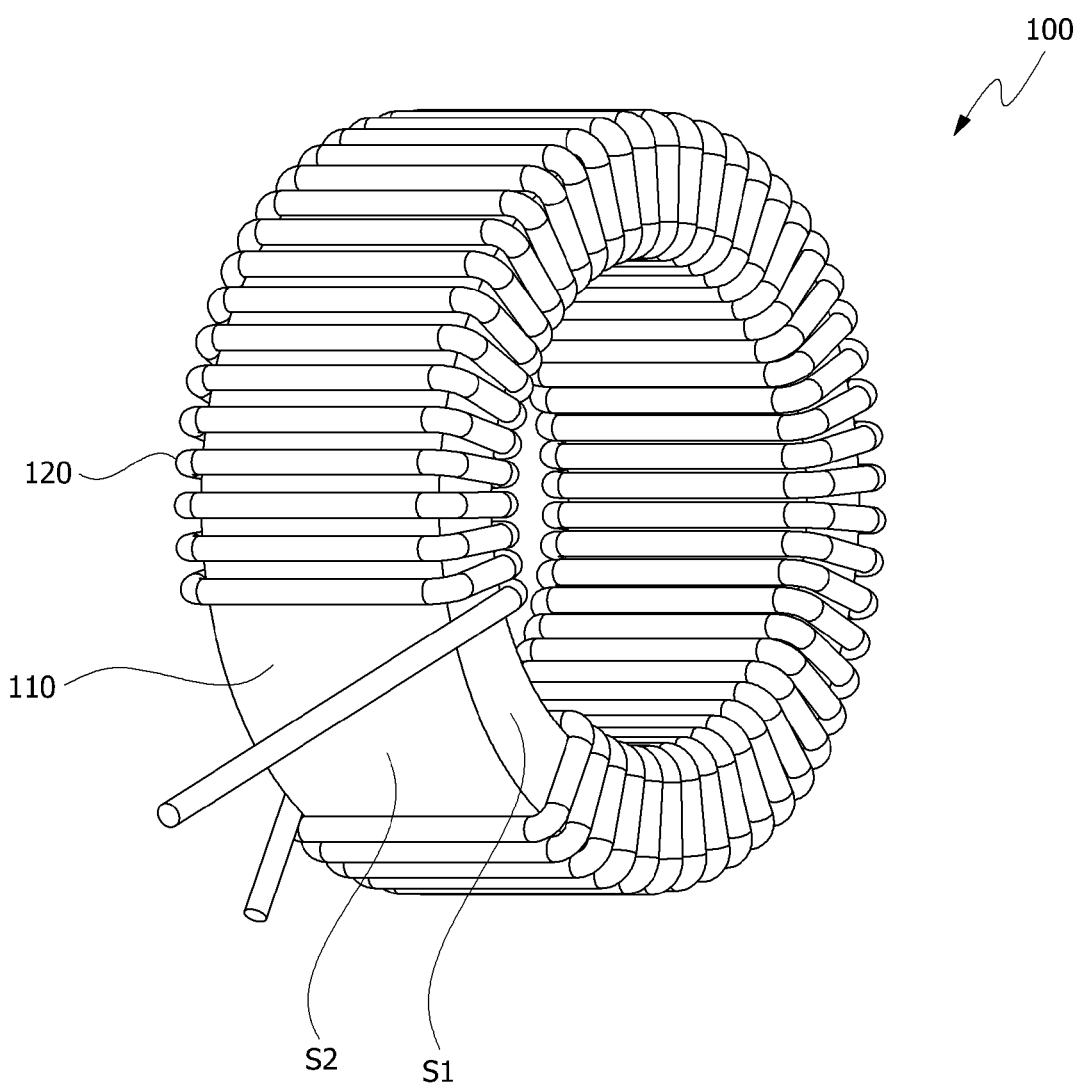
FIG. 2 is a perspective view of an inductor according to an embodiment of the present invention.
Figure 3:
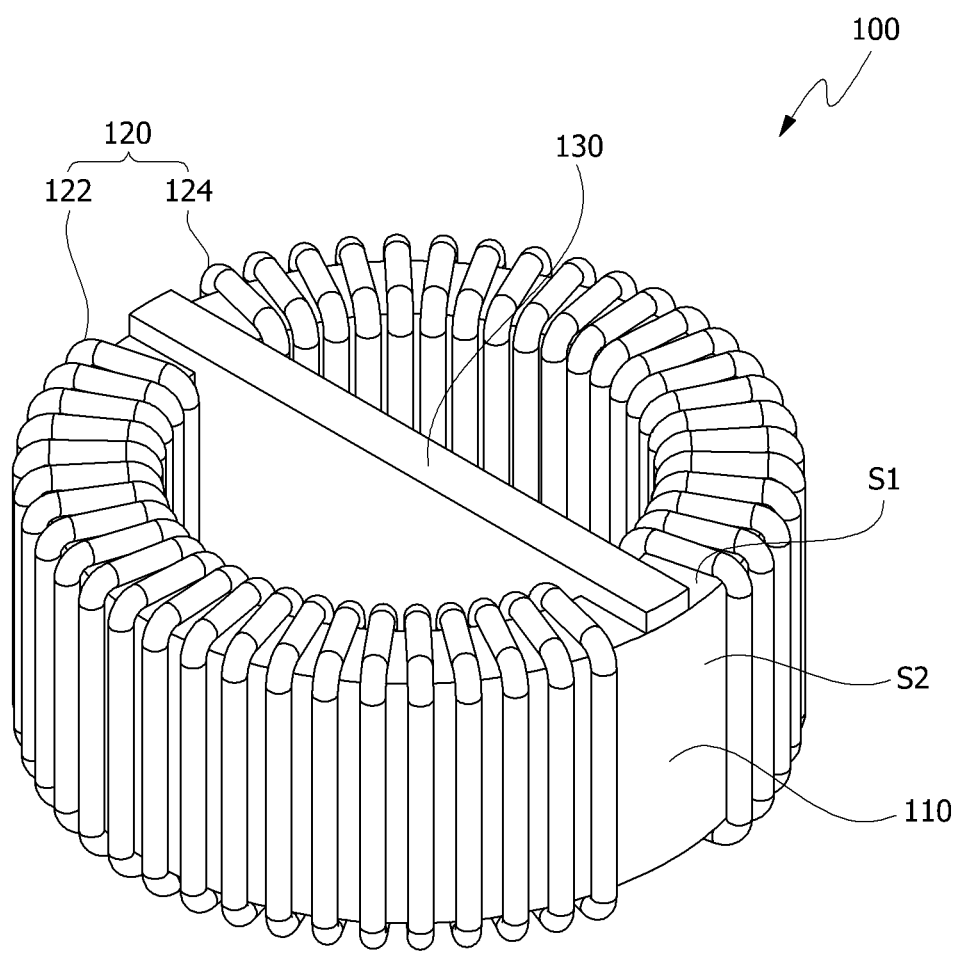
FIG. 3 is a perspective view of an inductor according to another embodiment of the present invention.

FIG. 2 is a perspective view of an inductor according to an embodiment of the present invention, and FIG. 3 is a perspective view of an inductor according to another embodiment of the present invention.

Referring to FIGS. 2 and 3, an inductor 100 includes a magnetic core 110 and coils 120 wound around the magnetic core 110. In this case, the magnetic core 110 may have a toroidal shape, and the coils 120 may be wound around the magnetic core 110.

Each of the coils 120 may be wound around an upper surface S1, an outer circumferential surface S2, a lower surface S3, and an inner circumferential surface S4 of the toroidal magnetic core 110. A bobbin for insulating the magnetic core 110 from the coils 120 may be further disposed between the magnetic core 110 and the coils 120. The coil 120 may be made of a conducting wire whose surface is coated with an insulating material. The conducting wire may include copper, silver, aluminum, gold, nickel, tin, or the like whose surface is coated with an insulating material, and a cross section of the conducting wire may have a circular or square shape.

Referring to FIG. 3, the coils 120 may include a first coil 122 and a second coil 124 which is wound to be symmetrical with the first coil 122. In this case, a separator 130 may be further disposed between the first coil 122 and the second coil 124, and the first coil 122 and the second coil 124 may be symmetrically disposed with respect to the separator 130.

According to the embodiment of the present invention, the magnetic core 110 may include different types of magnetic bodies.

Figure 4:
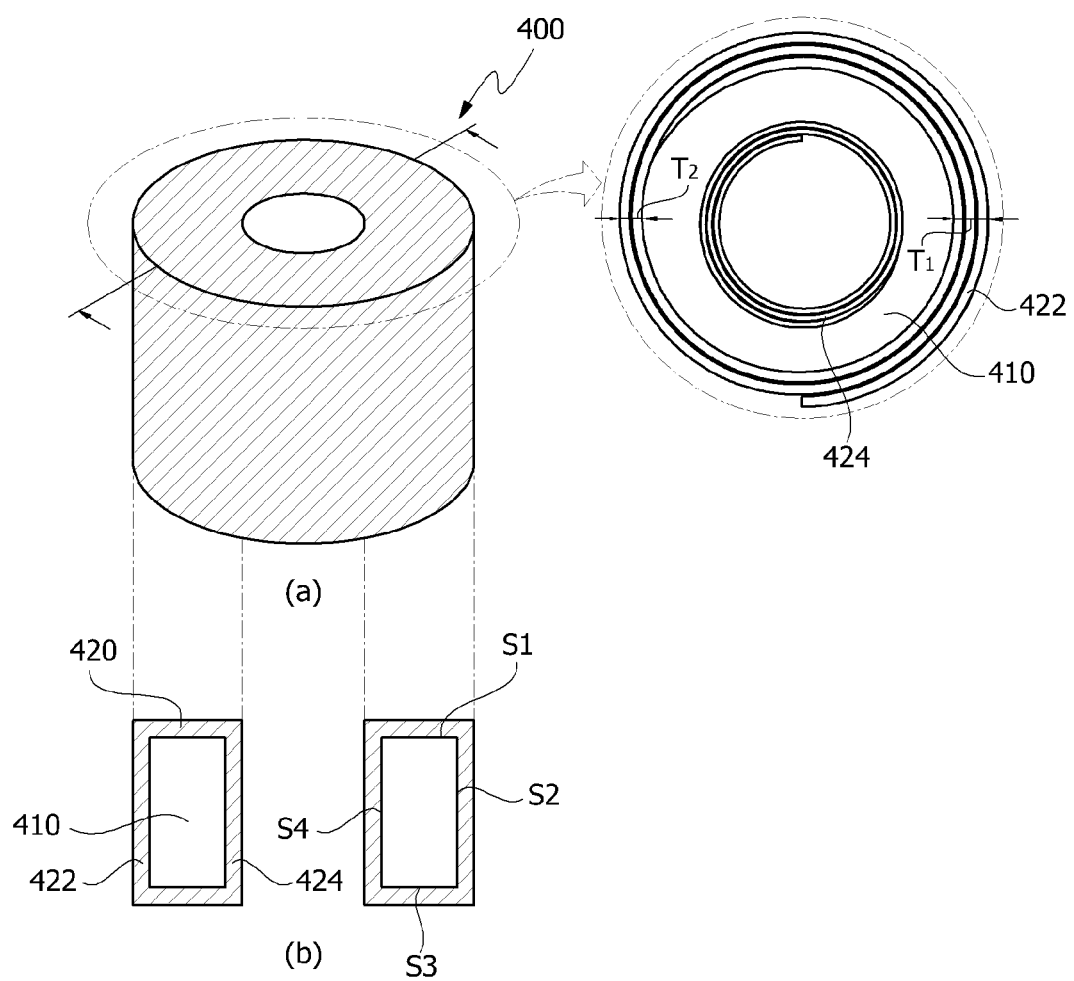
FIG. 4 shows a perspective view and a cross-sectional view of a magnetic core according to an embodiment of the present invention.

FIG. 4 shows a perspective view and a cross-sectional view of a magnetic core according to an embodiment of the present invention.

Referring to FIG. 4, a magnetic core 400 includes a first magnetic body 410 and a second magnetic body 420, and the first magnetic body 410 and the second magnetic body 420 are different types of magnetic bodies.

In this case, the second magnetic body 420 may be disposed on a surface of the first magnetic body 410. In this case, the second magnetic body 420 may be disposed on all of an upper surface S1, an outer circumferential surface S2, a lower surface S3, and an inner circumferential surface S4 of the first magnetic body 410.

Here, the second magnetic body 420 may have a higher saturation magnetic flux density than the first magnetic body 410. For example, the first magnetic body 410 may include ferrite, and the second magnetic body 420 may include a metal ribbon. Here, the metal ribbon may refer to a thin metal strip made of a metal material, that is, a long and thin band-shaped metal plate, but the embodiment is not limited thereto.

For example, a ratio of a thickness of a magnetic body 424 disposed inside the first magnetic body 410 in a radial direction of the first magnetic body 410, that is, disposed on the inner circumferential surface S4 of the first magnetic body 410, to a thickness of the first magnetic body 410 may range from 1:16 to 1:80, and a ratio of a thickness of a magnetic body 422 disposed outside the first magnetic body 410 in the radial direction of the first magnetic body 410, that is, disposed on the outer circumferential surface S2 of the first magnetic body 410, to the thickness of the first magnetic body 410 may range from 1:16 to 1:80. In this specification, a magnetic body of the second magnetic body 420, which is disposed on the inner circumferential surface S4 of the first magnetic body 410, may be referred to as an inner side magnetic body 424, and a magnetic body of the second magnetic body 420, which is disposed on the outer circumferential surface S2 of the first magnetic body 410, may be referred to as an outer side magnetic body 422.

For example, a thickness of each of the inner side magnetic body 424 and the outer side magnetic body 422 in the radial direction of the first magnetic body 410 may range from 190 μm to 210 μm.

Further, a ratio of a thickness of the outer side magnetic body 422 in the radial direction (e.g., a y-axis direction or an x-axis direction) of the first magnetic body 410 to the thickness of the first magnetic body 410 may range from 1:16 to 1:80 and, preferably, 1:20 to 1:40, but the embodiment is not limited thereto. In this case, the number of turns by which the outer side magnetic body 422 is wound may range from 7 to 27 and, preferably, 10 to 24.

Further, a ratio of a thickness of the inner side magnetic body 424 in the radial direction (e.g., the y-axis direction or the x-axis direction) of the first magnetic body 410 to the thickness of the first magnetic body 410 may range from 1:16 to 1:80 and, for example, 1:20 to 1:40, but the embodiment is not limited thereto. In this case, the number of turns by which the inner side magnetic body 424 is wound may range from 7 to 27 and, preferably, 10 to 24.

As described above, when the magnetic core 400 includes different types of magnetic bodies having different permeability, it is possible to remove noise in a wide frequency band. Specifically, in the magnetic core 400, as compared with the toroidal magnetic core made of only ferrite, a phenomenon in which a magnetic flux is concentrated on the surface of the magnetic core is prevented, and thus an effect of removing high-frequency noise is large and a degree of internal saturation is reduced so that the magnetic core is applicable to high power products.

Figure 5:
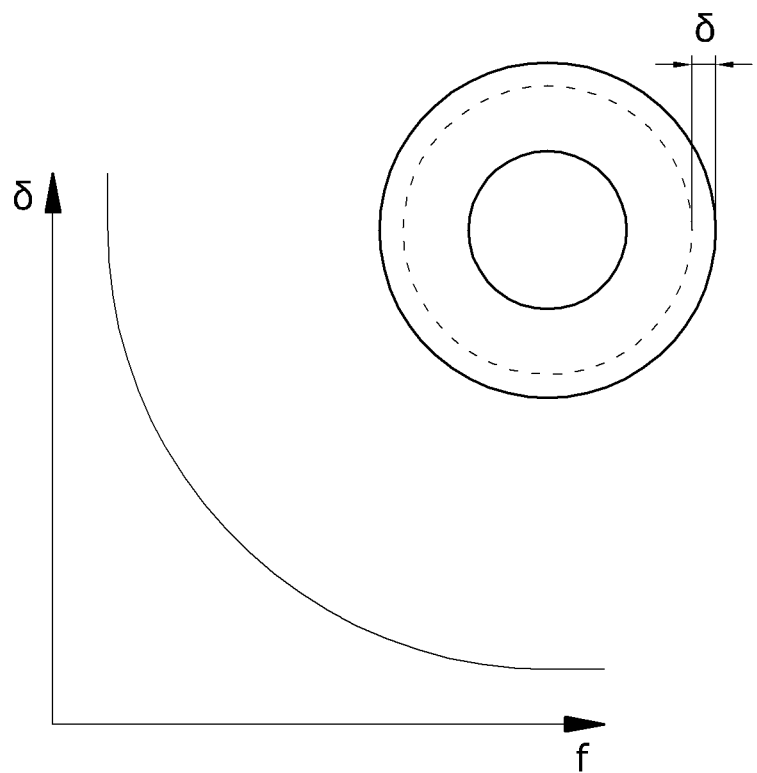
FIG. 5 is a graph showing skin effect theory.
Figure 6:
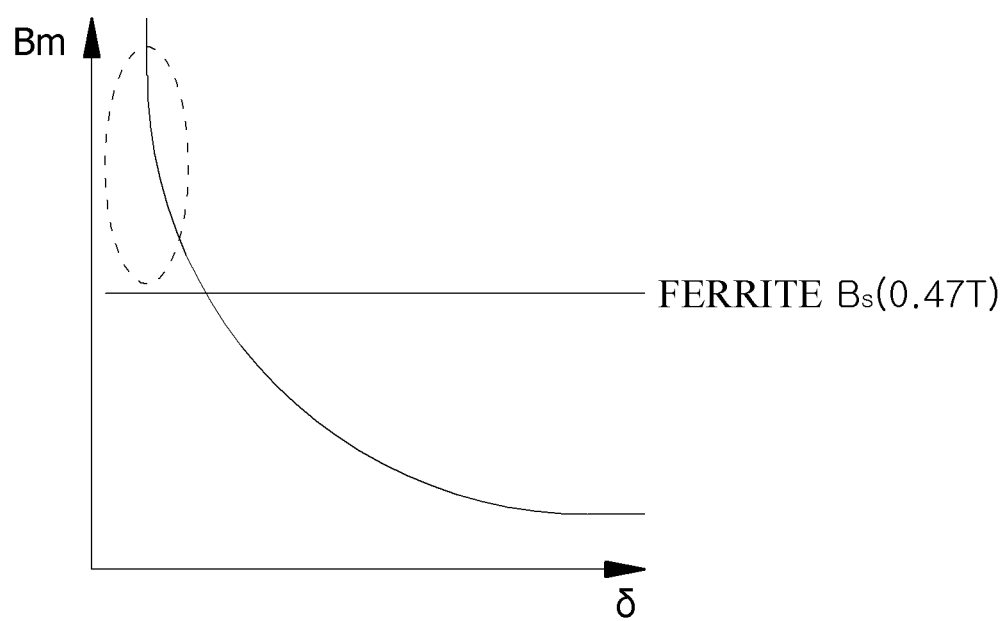
FIG. 6 is a graph showing a magnetic flux with respect to a skin depth of a ferrite material.
Figure 7:
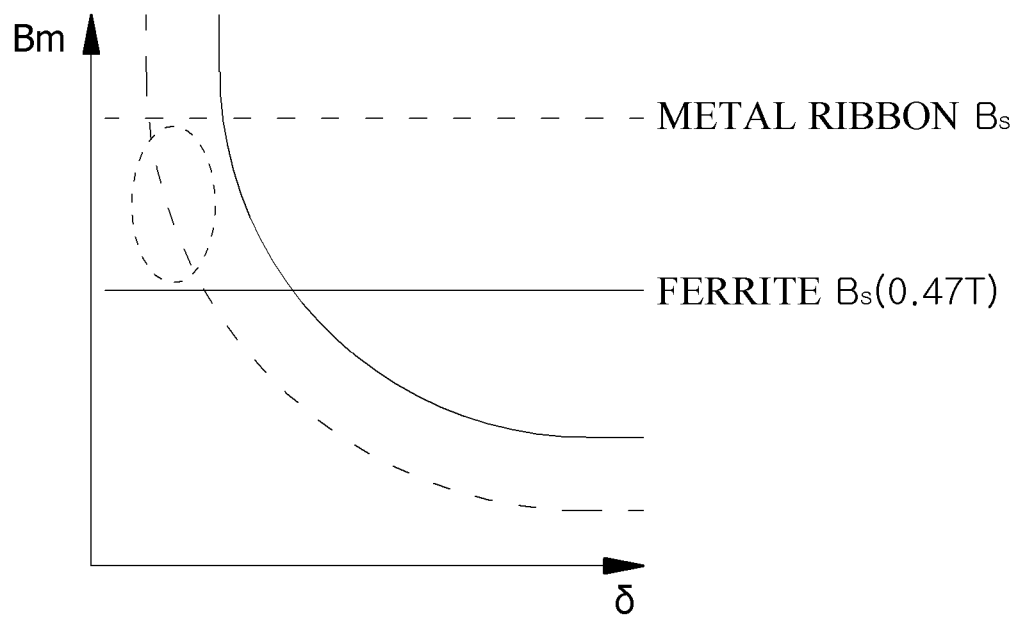
FIG. 7 is a graph showing a magnetic flux with respect to a skin depth of a ferrite material and a magnetic flux with respect to a skin depth of a metal ribbon material.
Figure 8:
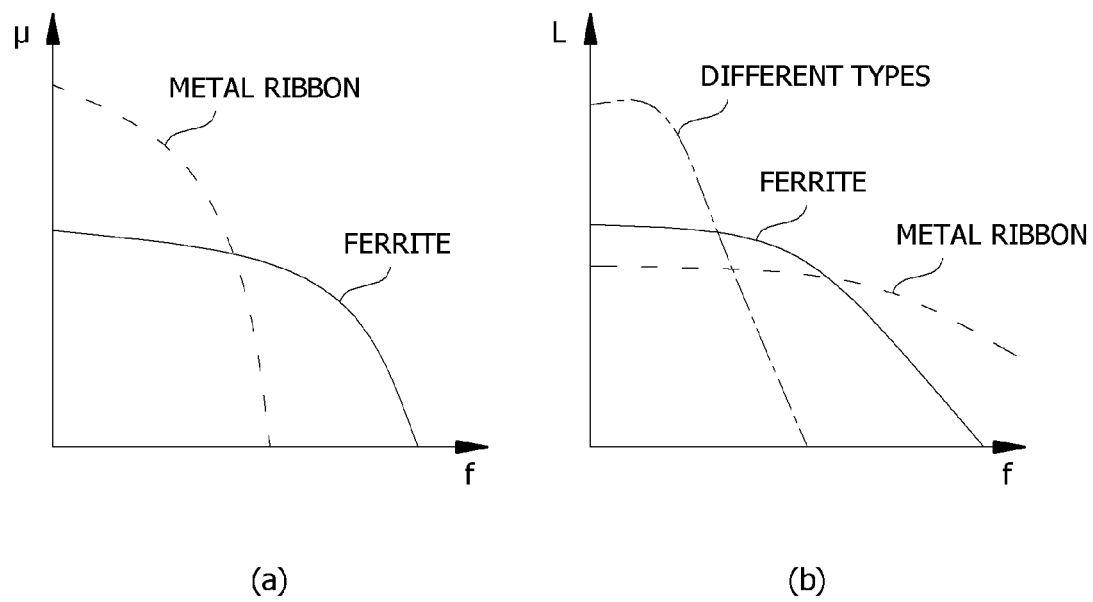
FIG. 8 shows graphs showing a permeability and an inductance of a ferrite material and a permeability and an inductance of a metal ribbon material.

FIG. 5 is a graph showing skin effect theory, FIG. 6 is a graph showing a magnetic flux with respect to a skin depth of a ferrite material, FIG. 7 is a graph showing a magnetic flux with respect to a skin depth of a ferrite material and a magnetic flux with respect to a skin depth of a metal ribbon material, and FIG. 8 shows graphs showing a permeability and an inductance of a ferrite material and a permeability and an inductance of a metal ribbon material.

Referring to FIG. 5 and Expression 1 shown below, a skin depth value decreases as a relative permeability of a material increases and a higher frequency flows. Accordingly, a phenomenon in which a magnetic flux is concentrated on a surface of a material occurs.

$$\delta \propto \frac{\rho}{\mu_s * f}$$ [Expression 1]

Here, δ denotes a skin depth, p denotes a resistivity, s denotes a relative permeability, and f denotes a frequency.

Referring to FIG. 6, as the skin depth (δ) decreases, a high magnetic flux (Bm) flows. A saturation magnetic flux density of the ferrite material is 0.47 T. Therefore, in the case in which a magnetic core is a ferrite core, the magnetic core is saturated when a magnetic flux is greater than 0.47 T, and thus noise removal performance may be degraded.

Referring to FIG. 7, when a material having a saturation magnetic flux density greater than the saturation magnetic flux density of the ferrite material, for example, a metal ribbon material, is disposed on a surface of the ferrite material, the material may withstand a high magnetic flux at a small skin depth, and thus noise performance may be maintained.

As described above, when the second magnetic body having a higher saturation magnetic flux density than the first magnetic body is disposed on at least a portion of the surface of the first magnetic body, an effective cross-sectional area of the magnetic core may be increased at a high frequency.

Meanwhile, referring to FIG. 8, it can be seen that the magnetic core including both of the ferrite material and the metal ribbon material having different permeability per frequency has a high inductance in a predetermined frequency region and thus high noise removal performance may be obtained.

Figure 9:
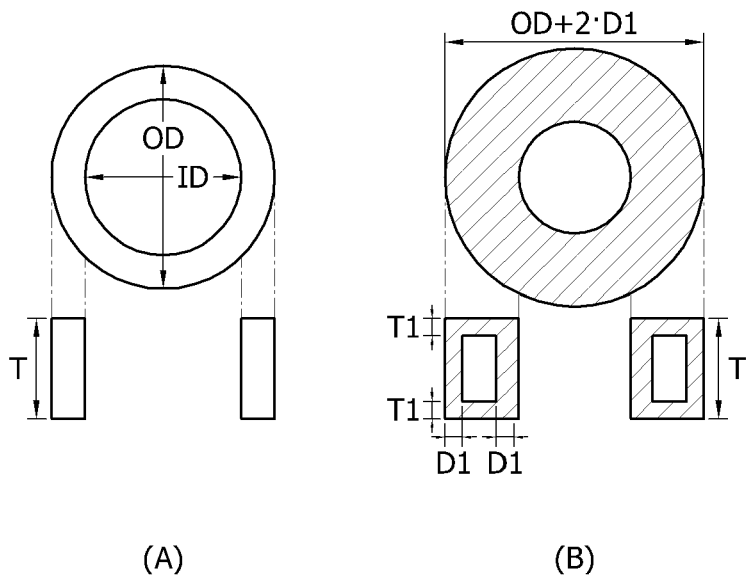
FIG. 9 shows a top view and a cross-sectional view of a magnetic core in which a second magnetic body is not disposed on a surface of a first magnetic body and a top view and a cross-sectional view of a magnetic core in which a second magnetic body is disposed on a surface of a first magnetic body.
Figure 10:
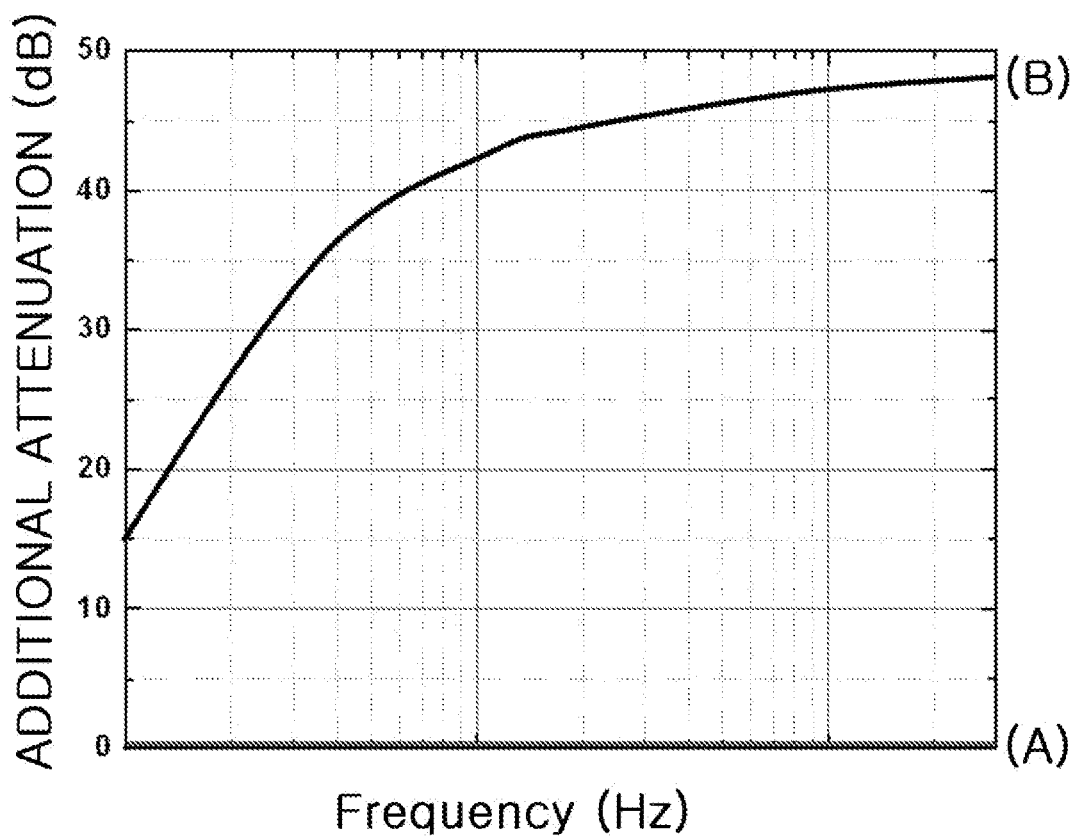
FIG. 10 is a graph showing noise removal performance of the magnetic cores of FIG. 9.

FIG. 9 shows a top view and a cross-sectional view of a magnetic core in which a second magnetic body is not disposed on a surface of a first magnetic body and a top view and a cross-sectional view of a magnetic core in which a second magnetic body is disposed on a surface of a first magnetic body, and FIG. 10 is a graph showing noise removal performance of the magnetic cores of FIG. 9.

Referring to FIG. 9, a first magnetic body has an inner diameter ID and an outer diameter OD, which are in a range of 15 mm and 25 mm, and is made of a Mn—Zn based ferrite core having a toroidal shape. A second magnetic body is made of an Fe—Si based metal ribbon and stacked to have a thickness of 2 mm. A magnetic core in (A) in which a second magnetic body is not disposed on a surface of a first magnetic body and a magnetic core in (B) in which a second magnetic body is disposed on a surface of a first magnetic body are all manufactured to have a height T of 15 mm. That is, the height of the first magnetic body is adjusted to have a total height of 15 mm including metal ribbons having a thickness of 2 mm which are stacked on each of an upper surface and a lower surface of the first magnetic body in the magnetic core in (B). Coils are wound 21 turns around the magnetic core in (A) in which the second magnetic body is not disposed on the surface of the first magnetic body and the magnetic core in (B) in which the second magnetic body is disposed on the surface of the first magnetic body, and noise removal performance is simulated under conditions of an applied current of 1 A and power of 220 W.

As a result, referring to FIG. 10, when it is assumed that a noise attenuation rate of the magnetic core in (A), in which the second magnetic body is not disposed on the surface of the first magnetic body, is set to zero as a reference value, it can be seen that the magnetic core in (B), in which the second magnetic body is disposed on the surface of the first magnetic body, has an additional noise attenuation rate (additional attenuation) over an entire frequency band. That is, it can be seen that the magnetic core in (B) in which the second magnetic body is disposed on the surface of the first magnetic body has higher noise removing performance than the magnetic core in (A) in which the second magnetic body is not disposed on the surface of the first magnetic body.

Meanwhile, the magnetic core according to the embodiment of the present invention may include a plurality of stacked sub-magnetic cores.

Figure 11:
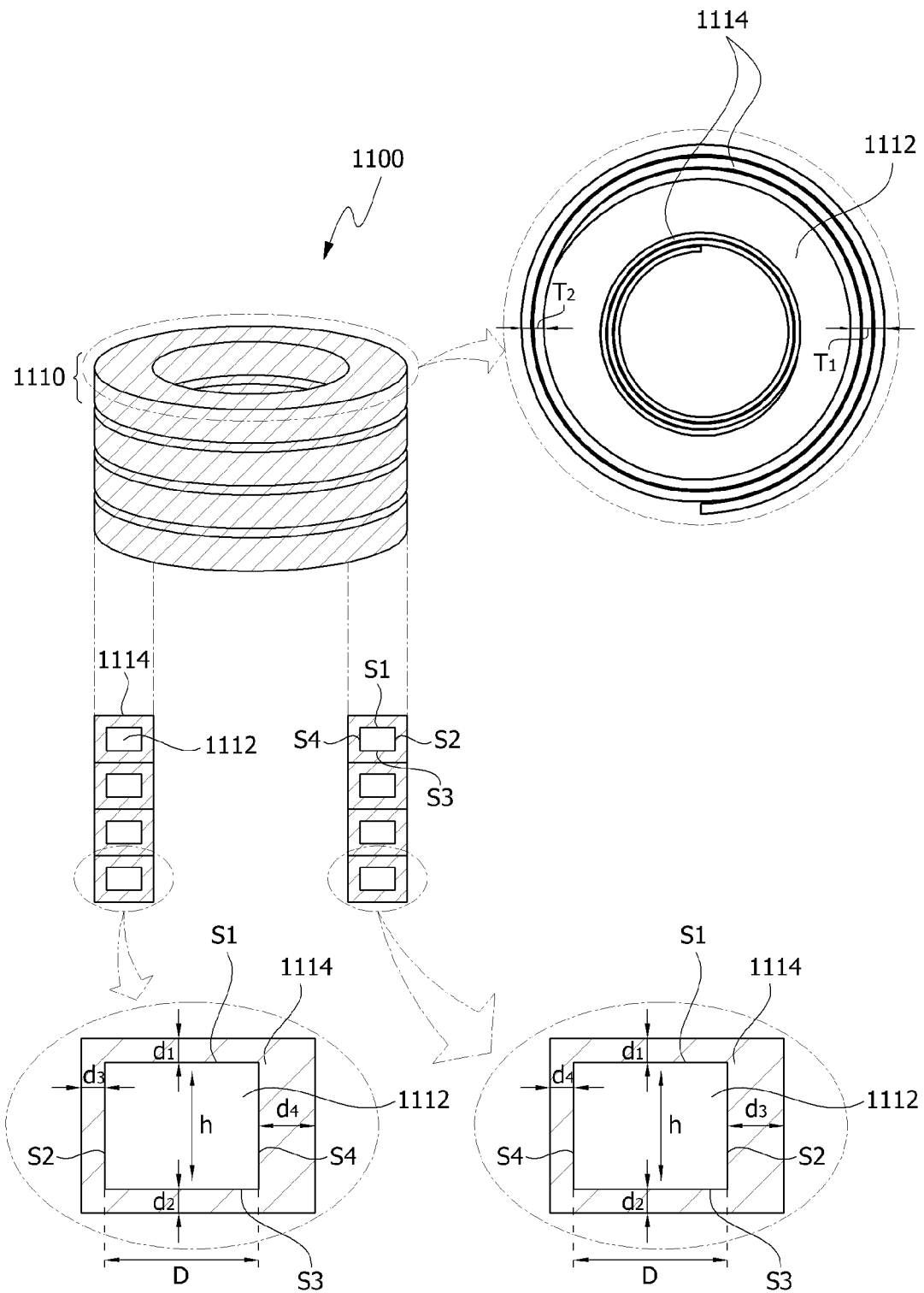
FIG. 11 shows a perspective view and a cross-sectional view of a magnetic core according to an embodiment of the present invention.

FIG. 11 shows a perspective view and a cross-sectional view of a magnetic core according to an embodiment of the present invention.

Referring to FIG. 11, a magnetic core 1100 includes a plurality of stacked sub-magnetic cores 1110. Each of the sub-magnetic cores 1110 includes a first magnetic body 1112 and a second magnetic body 1114, and the first magnetic body 1112 and the second magnetic body 1114 are different types of magnetic bodies.

In this case, the second magnetic body 1114 may be disposed on a surface of the first magnetic body 1112. In this case, the second magnetic body 1114 may be disposed on all of an upper surface S1, an outer circumferential surface S2, a lower surface S3, and an inner circumferential surface S4 of the first magnetic body 1112.

Here, the second magnetic body 1114 may have a higher permeability and a higher saturation magnetic flux density than the first magnetic body 1112. For example, the first magnetic body 1112 may include ferrite, and the second magnetic body 1114 may include a metal ribbon.

Here, a permeability (μ) of the ferrite may range from 2,000 to 15,000, and a permeability (μ) of the metal ribbon may range from 100,000 to 150,000. In particular, the ferrite may be a Mn—Zn based ferrite, and the metal ribbon may be an Fe based nanocrystalline metal ribbon. The Fe based nanocrystalline metal ribbon may be a nanocrystalline metal ribbon containing Fe and Si.

Here, the term "nanocrystalline" may mean that a crystal has a size of 10 nm to 100 nm.

The first magnetic body 1112 may be manufactured by a method of coating ferrite powder with ceramic or a polymer binder, then insulating the ferrite powder, and molding the ferrite powder at a high pressure. Alternatively, the first magnetic body 1112 may be manufactured by a method of stacking a plurality of ferrite sheets which are formed by coating ferrite powder with ceramic or a polymer binder and then insulating the ferrite powder.

As described above, when the magnetic core 1100 includes different types of magnetic bodies, it is possible to remove noise in a wide frequency band.

In this case, the first magnetic body 1112 and the second magnetic body 1114 may each have a toroidal shape, and the second magnetic body 1114 may be disposed on the upper surface S1, the outer circumferential surface S2, the lower surface S3, and the inner circumferential surface S4 of the first magnetic body 1112.

A thickness d1 of the second magnetic body 1114 disposed on the upper surface S1 of the first magnetic body 1112 and a thickness d2 of the second magnetic body 1114 disposed on the lower surface S3 of the first magnetic body 1112 may each be smaller than a height h of the first magnetic body 1112, that is, a distance between the upper surface S1 and the lower surface S3 of the first magnetic body 1112. In addition, a thickness d3 of the second magnetic body 1114 disposed on the outer circumferential surface S2 of the first magnetic body 1112 and a thickness d4 of the second magnetic body 1114 disposed on the inner circumferential surface S4 of the first magnetic body 1112 may each be smaller than a thickness D of the first magnetic body 1112, that is, a distance between the outer circumferential surface S2 and the inner circumferential surface S4 of the first magnetic body 1112. For example, the thickness d1 of the second magnetic body 1114 disposed on the upper surface S1 of the first magnetic body 1112 and the thickness d2 of the second magnetic body 1114 disposed on the lower surface S3 of the first magnetic body 1112 may each range from 1 to 30% of the height h of the first magnetic body 1112, preferably, 5 to 25% and, more preferably, 10 to 20%. Further, the thickness d3 of the second magnetic body 1114 disposed on the outer circumferential surface S2 of the first magnetic body 1112 and the thickness d4 of the second magnetic body 1114 disposed on the inner circumferential surface S4 of the first magnetic body 1112 may each range from 1 to 30% of the thickness D of the first magnetic body 1112, preferably, 5 to 25% and, more preferably, 10 to 20%. When the second magnetic body 1114 has a value smaller than a lower limit value of the numerical value ranges, a manufacturing process is not easy and it is difficult to obtain a desired level of noise removal performance at a high frequency. Further, when the second magnetic body 1114 has a value greater than the lower limit value of the numerical value ranges, a material cost rises and it is difficult to obtain a desired level of noise removal performance. When a ratio of each of the thickness d1 of the second magnetic body 1114 disposed on the upper surface S1 of the first magnetic body 1112 and the thickness d2 of the second magnetic body 1114 disposed on the lower surface S3 of the first magnetic body 1112 to the height h of the first magnetic body 1112 is adjusted or a ratio of each of the thickness d3 of the second magnetic body 1114 disposed on the outer circumferential surface S2 of the first magnetic body 1112 and the thickness d4 of the second magnetic body 1114 disposed on the inner circumferential surface S4 of the first magnetic body 1112 to the thickness D of the first magnetic body 1112 is adjusted, a permeability of the magnetic core 1100 may be adjusted.

To this end, the second magnetic body 1114 disposed on each of the upper surface S1 and the lower surface S3 of the first magnetic body 1112 may include a metal ribbon in which a plurality of layers are stacked.

To this end, the second magnetic body 1114 may be adhered to the upper surface S1 and the lower surface S3 of the first magnetic body 1112. An adhesive used in this case may be an adhesive containing at least one of an epoxy-based resin, an acrylic-based resin, a silicone-based resin, and varnish. As described above, when different types of magnetic bodies are bonded using an adhesive, performance degradation does not occur even during physical vibration. Meanwhile, the second magnetic body 1114 disposed on each of the outer circumferential surface S2 and the inner circumferential surface S4 of the first magnetic body 1112 may include a metal ribbon in which a plurality of layers are wound.

To this end, the second magnetic body 1114, which is a metal ribbon, may be wound around the outer circumferential surface S2 of the toroidal first magnetic body 1112. In this case, it is possible to adjust the number of windings and the thickness of the second magnetic body 1114 according to a permeability to be obtained. Further, the second magnetic body 1114, which is a metal ribbon pre-wound in a toroidal shape, may be inserted into a hollow of the first magnetic body 1112. The pre-wound second magnetic body 1114 may be unrolled to fit the size of the inner circumferential surface S4 of the first magnetic body 1112.

In this case, the outer circumferential surface S2 of the first magnetic body 1112 and the second magnetic body 1114 may be adhered by the adhesive, and the inner circumferential surface S4 of the first magnetic body 1112 and the second magnetic body 1114 may be adhered by the adhesive. The adhesive used in this case may be an adhesive containing at least one of an epoxy-based resin, an acrylic-based resin, a silicone-based resin, and varnish. As described above, when different types of magnetic bodies are bonded using the adhesive, performance degradation does not occur even during physical vibration.

Here, the second magnetic body 1114 disposed on the outer circumferential surface S2 and the inner circumferential surface S4 of the first magnetic body 1112 may include a metal ribbon which is wound by winding a plurality of times and in which a plurality of layers are stacked. The thickness and the permeability of the second magnetic body 1114 may be changed according to the number of stacked layers of the metal ribbon, and thus the permeability of the magnetic core 1100 may be changed and noise removal performance of an EMI filter to which the magnetic core 1100 is applied may be changed.

That is, the noise removal performance may be changed according to the thickness of the second magnetic body 1114. Using the above principle, the number of layers, which are stacked so that the thickness of the second magnetic body 1114 disposed in the region in which the coils are wound is greater than the thickness of the second magnetic body 1114 disposed in the region in which no coil is wound, of the metal ribbon may be adjusted. That is, the number of layers of the metal ribbon disposed in the region in which the coils are wound may differ from the number of layers of the metal ribbon disposed in the region in which no coil is wound.

The number of layers of the metal ribbon may be adjusted by the number of windings, a winding start point, and a winding end point. That is, when the second magnetic body 1114, which is a metal ribbon, is wound around the outer circumferential surface S2 of the first magnetic body 1112 one turn from the winding start point, the second magnetic body 1114 may include a single-layer metal ribbon, and when the second magnetic body 1114, which is a metal ribbon, is wound around the outer circumferential surface S2 of the first magnetic body 1112 two turns from the winding start point, the second magnetic body 1114 may include a two-layer metal ribbon. Meanwhile, when the winding start point and the winding end point are different, for example, when the second magnetic body 1114 is wound around the outer circumferential surface S2 of the first magnetic body 1112 one and half turns from the winding start point, the second magnetic body 1114 includes a region in which the metal ribbon is stacked in a single layer and a region in which the metal ribbon is stacked in two layers. Alternatively, when the second magnetic body 1114 is wound around the outer circumferential surface S2 of the first magnetic body 1112 two and half turns from the winding start point, the second magnetic body 1114 includes a region in which the metal ribbon is stacked in two layers and a region in which the metal ribbon is stacked in three layers. In this case, when the coils are disposed in the region in which the number of stacked layers is larger, the noise removal performance of the EMI filter to which the magnetic core 1100 according to the embodiment of the present invention is applied may be further improved.

For example, when the magnetic core 1100 has a toroidal shape and a first coil and a second coil are wound around the magnetic core 1100 so as to be symmetrical with each other, the first coil may be disposed in the region in which the number of stacked layers of the second magnetic body 1114 disposed on the outer circumferential surface of the first magnetic body 1112 is large, and the second coil may be disposed in the region in which the number of stacked layers of the second magnetic body 1114 disposed on the inner circumferential surface of the first magnetic body 1112 is large. Accordingly, both of the first coil and the second coil are disposed in the region in which the number of stacked layers of the second magnetic body 1114 is large and are not disposed in the region in which the number of stacked layers is small, and thus high noise removal performance may be obtained.

The second magnetic body 1114 disposed on each of the upper surface S1, the outer circumferential surface S2, the lower surface S3, and the inner circumferential surface S4 of the first magnetic body 1112 are shown as having the same material and thickness, but the present invention is not limited thereto. The second magnetic body 1114 disposed on each of the upper surface S1, the outer circumferential surface S2, the lower surface S3, and the inner circumferential surface S4 of the first magnetic body 1112 may have different materials or different permeability and may have different thicknesses. Accordingly, the permeability of the magnetic core 1100 may have various ranges.

As described above, when the magnetic core 1100 includes different types of magnetic bodies having different permeability, it is possible to remove noise in a wide frequency band. Specifically, in the magnetic core 1100, as compared with the toroidal magnetic core made of only a Mn—Zn based ferrite, a phenomenon in which a magnetic flux is concentrated on the surface of the magnetic core is prevented, and thus an effect of removing high-frequency noise is large and a degree of internal saturation is reduced so that the magnetic core is applicable to high power products.

Specifically, according to the embodiment of the present invention, the magnetic core 1100 may include a plurality of stacked sub-magnetic cores 1110. The number of sub-magnetic cores 1110 may be two or more, preferably, four or more, and more preferably, eight or more.

As described above, when the magnetic core 1100 includes the plurality of stacked sub-magnetic cores 1110, when each of the sub-magnetic cores 1110 includes the first magnetic body 1112 and the second magnetic body 1114, and when the second magnetic body 1114 is formed on the surface of the first magnetic body 1112, it is possible to increase an effective area of the region in which the second magnetic body 1114 is disposed, thereby increasing a value of a high-frequency inductance (Ls).

Figure 12:
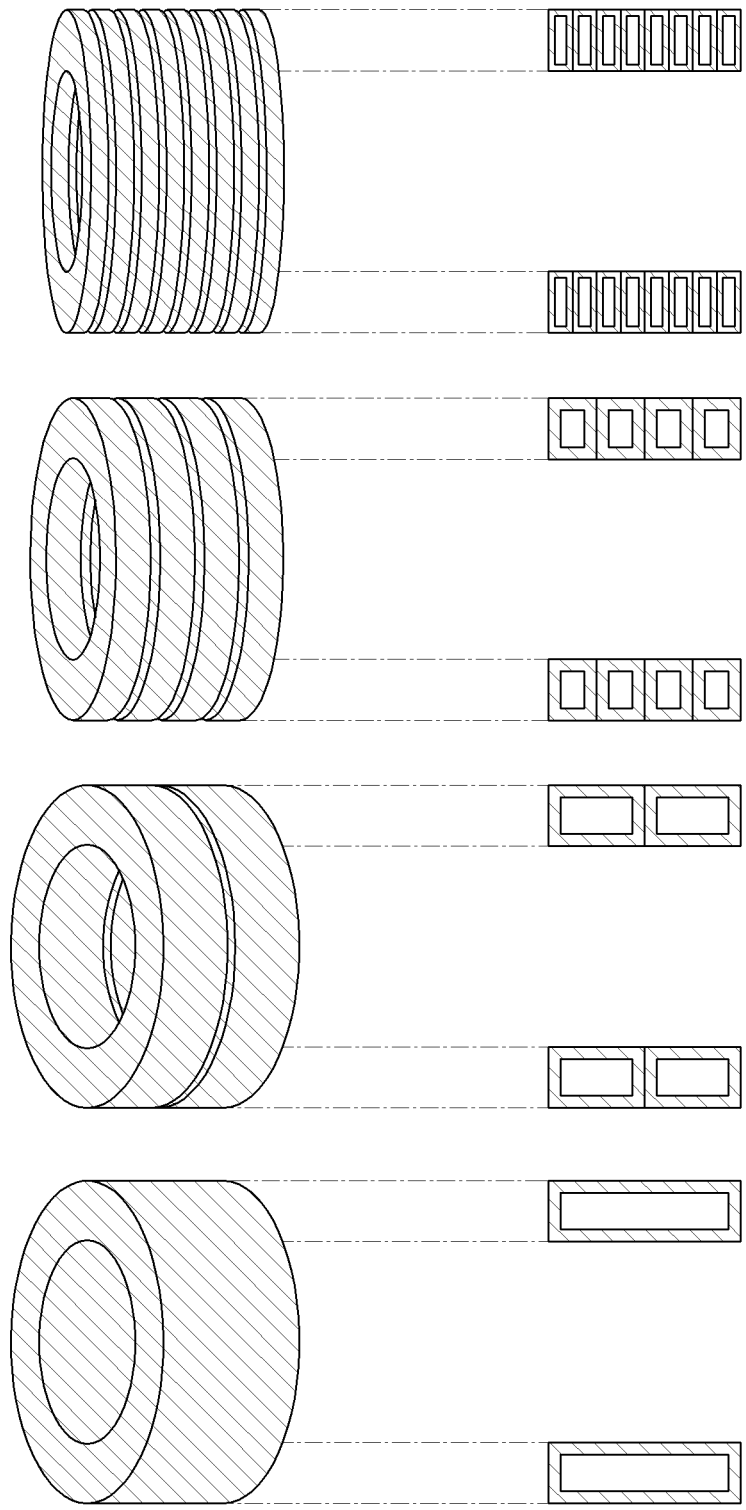
FIG. 12 shows perspective views of magnetic cores according to a Comparative Example and Examples.
Figure 13:
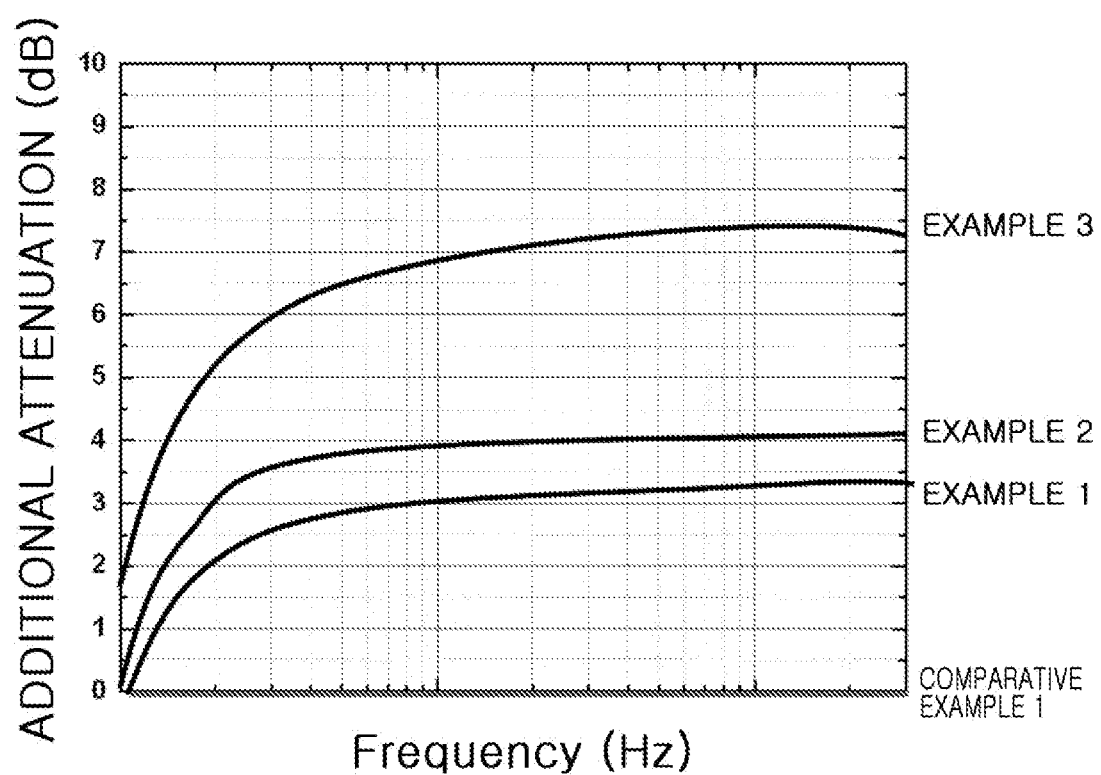
FIG. 13 is a graph showing noise removal performance of the magnetic cores according to Comparative Example and Examples.

FIG. 12 shows perspective views of magnetic cores according to a Comparative Example and Examples, and FIG. 13 is a graph showing noise removal performance of the magnetic cores according to Comparative Example and Examples.

Referring to FIG. 12, a magnetic core according to Comparative Example 1 has a structure in which a second magnetic body is disposed on an upper surface, an outer circumferential surface, a lower surface, and an inner circumferential surface of a toroidal first magnetic body. A magnetic core according to Example 1 includes two stacked sub-magnetic cores, and each of the sub-magnetic cores has a structure in which a second magnetic body is disposed on an upper surface, an outer circumferential surface, a lower surface, and an inner circumferential surface of a toroidal first magnetic body. A magnetic core according to Example 2 includes four stacked sub-magnetic cores, and each of the sub-magnetic cores has a structure in which a second magnetic body is disposed on an upper surface, an outer circumferential surface, a lower surface, and an inner circumferential surface of a toroidal first magnetic body. A magnetic core according to Example 3 includes eight stacked sub-magnetic cores, and each of the sub-magnetic cores has a structure in which a second magnetic body is disposed on an upper surface, an outer circumferential surface, a lower surface, and an inner circumferential surface of a toroidal first magnetic body.

In this case, the magnetic cores of Comparative Example 1 and Examples 1 to 3 are manufactured to have the same total size (including outer diameter, inner diameter, and height), the first magnetic body thereof is made of ferrite, and the second magnetic body thereof is made of a nanoribbon.

In Comparative Example 1, a total area of a region in which the second magnetic body is disposed is 885.5 mm2. In Example 1, a total area of a region in which the second magnetic body is disposed is 888.6 mm2. In Example 2, a total area of a region in which the second magnetic body is disposed is 894.9 mm2. In Example 3, a total area of a region in which the second magnetic body is disposed is 907.4 mm2.

Referring to FIG. 13, an attenuation (dB) value in Comparative Example 1 according to a frequency is set to zero, which is a reference value, and additional attenuation (dB) values in Examples 1 to 3 are shown. From this, it can be seen that a noise attenuation rate at a high frequency increases as the number of stacked sub-magnetic cores increases. This is because a magnetic flux, which is concentrated on a surface of each sub-magnetic core, is concentrated on different materials, thereby reducing a degree of saturation. Accordingly, since area efficiency is improved as the number of stacked sub-magnetic cores is increased, high-frequency inductance is increased and a noise removing effect at a high frequency is improved.

Further, as the number of stacked sub-magnetic cores is increased, an eddy current loss is reduced so that core loss is reduced.

Figure 14:
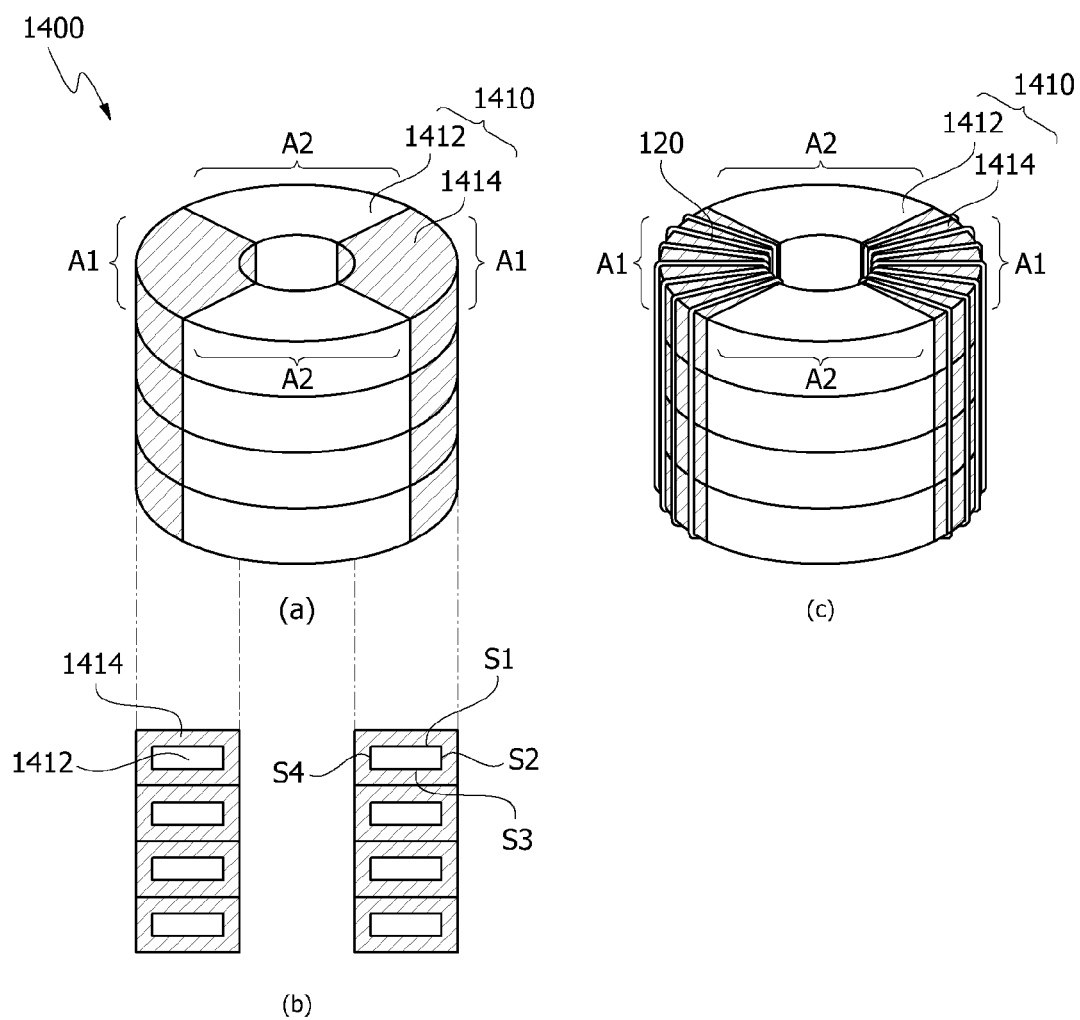
FIG. 14 shows a perspective view and a cross-sectional view of a magnetic core according to another embodiment of the present invention.

FIG. 14 shows a perspective view and a cross-sectional view of a magnetic core according to another embodiment of the present invention. Descriptions of the same contents as those in FIGS. 1 to 13 will not be repeated.

Referring to FIG. 14, a magnetic core 1400 may include a plurality of stacked sub-magnetic cores 1410, each of the sub-magnetic cores 1410 may include a first magnetic body 1412 and a second magnetic body 1414, the first magnetic body 1412 and the second magnetic body 1414 may be different magnetic bodies, and the second magnetic body 1414 may be disposed on at least a portion of a surface of the first magnetic body 1412. Here, the second magnetic body 1414 may have a higher saturation magnetic flux density than the first magnetic body 1412.

In this case, the first magnetic body 1412 may have a toroidal shape, and the second magnetic body 1414 may be disposed in a region in which coils are wound. For example, when the coils include a first coil which is wound around the magnetic core 1400 and a second coil which is wound to be symmetrical with the first coil, the second magnetic body 1414 may be disposed to surround an upper surface S1, an outer circumferential surface S2, a lower surface S3, and an inner circumferential surface S4 of the first magnetic body 1412 in each of the regions in which the first coil and the second coil are wound.

That is, the first magnetic body 1412 may be divided into a first region A1 in which the second magnetic body 1414 is disposed and a second region A2 in which the second magnetic body 1414 is disposed. In the first region A1, the second magnetic body 1414 may be disposed to surround the upper surface S1, the outer circumferential surface S2, the lower surface S3, and the inner circumferential surface S4 of the first magnetic body 1412 and, in the second region A2, the first magnetic body 1412 may be exposed to the outside.

In this case, a pair of first regions A1 may be disposed symmetrically to each other and a pair of second regions A2 may be disposed symmetrically to each other. The pair of first regions A1 may be disposed to be spaced apart from each other by the second region A2, and the pair of second regions A2 may be disposed to be spaced apart from each other by the first region A1.

The coils 120 may be wound around the first regions A1 and may be spaced apart from the second regions A2.

Figure 15:
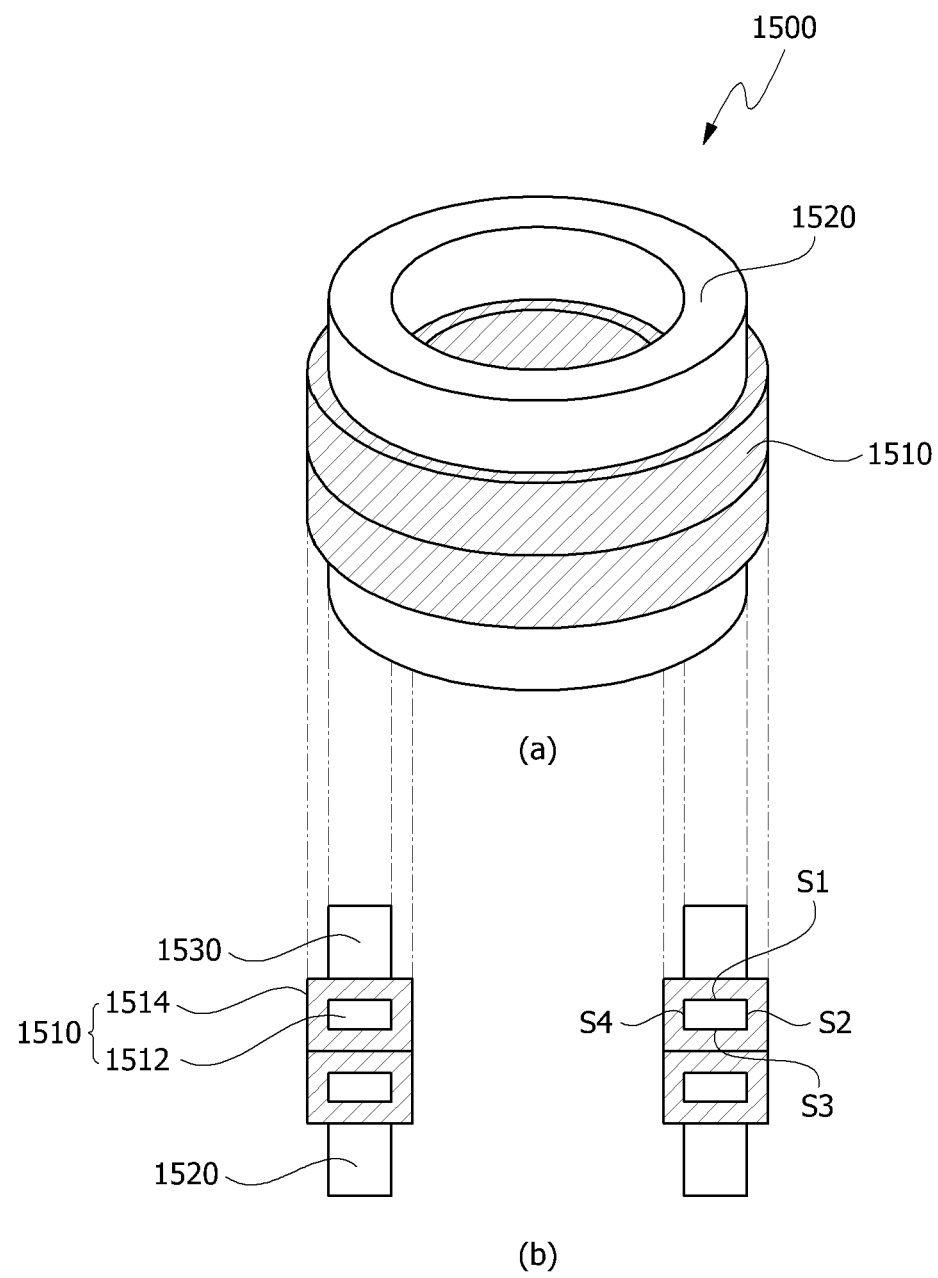
FIG. 15 shows a perspective view and a cross-sectional view of a magnetic core according to still another embodiment of the present invention.

FIG. 15 shows a perspective view and a cross-sectional view of a magnetic core according to still another embodiment of the present invention. Descriptions of the same contents as those in FIGS. 1 to 14 will not be repeated.

Referring to FIG. 15, a magnetic core 1500 may include a plurality of stacked sub-magnetic cores 1510, and each of the plurality of sub-magnetic cores 1510 may include a first magnetic body 1512 and a second magnetic body 1514. In addition, the magnetic core 1500 may further include a lower sub-magnetic core 1520 disposed on a lowermost sub-magnetic core of the plurality of sub-magnetic cores 1510 and an upper sub-magnetic core 1530 disposed on an uppermost sub-magnetic core of the plurality of sub-magnetic cores 1510, and the lower sub-magnetic core 1520 and the upper sub-magnetic core 1530 may each only include a first magnetic body.

In this case, the first magnetic body 1512 and the second magnetic body 1514 may be different types of magnetic bodies, and the second magnetic body 1514 may be disposed on a surface of the first magnetic body 1512. Here, the second magnetic body 1514 may have a higher saturation magnetic flux density than the first magnetic body 1512.

In this case, the first magnetic body 1512 may include a toroidal ferrite, and the second magnetic body 1514 may include a metal ribbon. The second magnetic body 1514 may be disposed to surround an upper surface S1, an outer circumferential surface S2, a lower surface S3, and an inner circumferential surface S4 of the first magnetic body 1512.

The remaining lower sub-magnetic cores 1520 of the plurality of sub-magnetic cores may be disposed on lowermost and uppermost layers of the plurality of stacked sub-magnetic cores. Accordingly, the second magnetic body is not disposed at a boundary between an upper surface and an outer circumferential surface of the magnetic core 1500, a boundary between a lower surface and the outer circumferential surface, a boundary between the lower surface and an inner circumferential surface, and a boundary between an upper surface and the inner circumferential surface, and thus it is possible to prevent a problem in that cracks are generated in the second magnetic body when the coils are wound.

Figure 16:
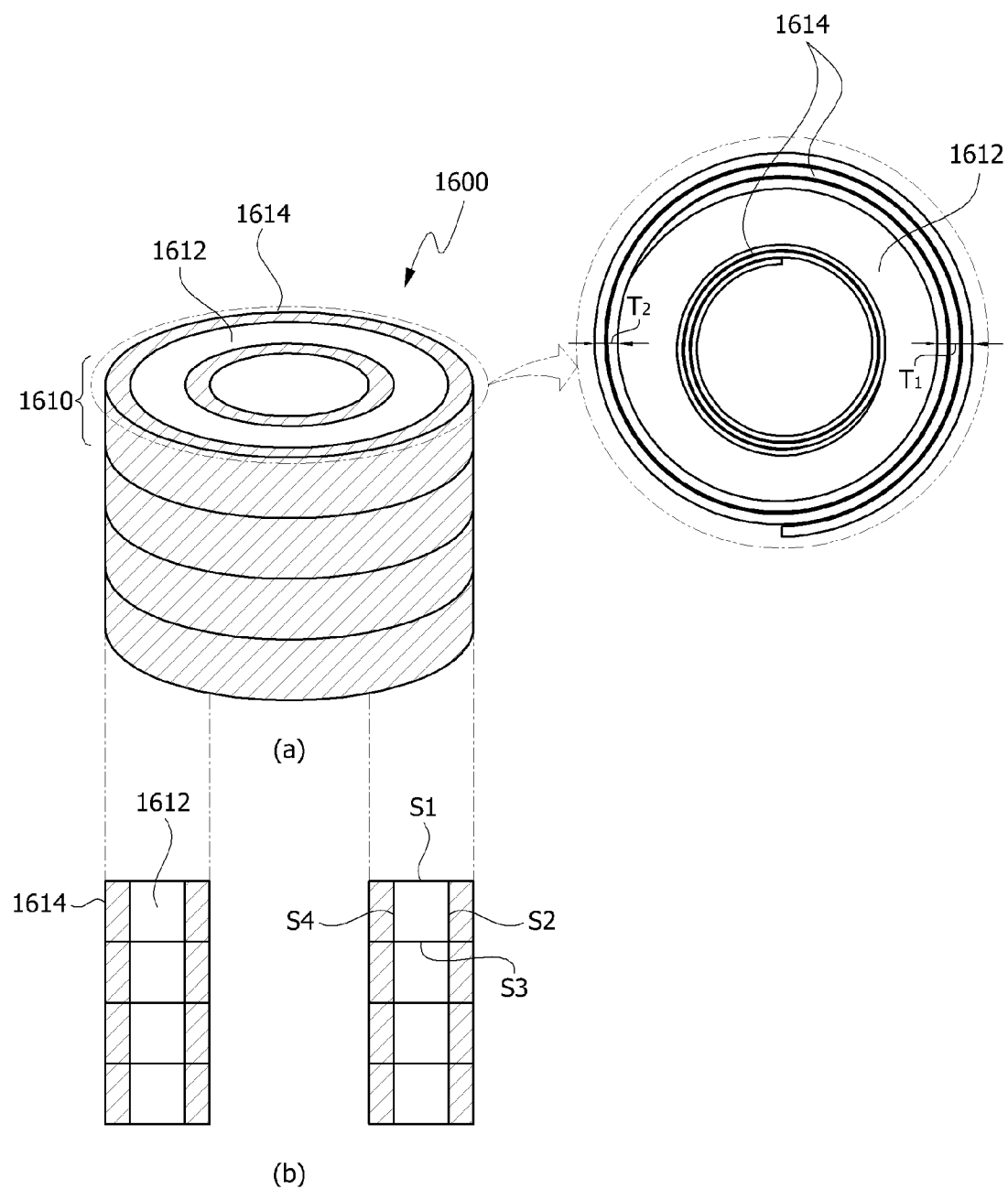
FIG. 16 shows a perspective view and a cross-sectional view of a magnetic core according to yet another embodiment of the present invention.

FIG. 16 shows a perspective view and a cross-sectional view of a magnetic core according to yet another embodiment of the present invention. Descriptions of the same contents as those in FIGS. 1 to 15 will not be repeated.

Referring to FIG. 16, a magnetic core 1600 may include a plurality of stacked sub-magnetic cores 1610, each of the sub-magnetic cores 1610 may include a first magnetic body 1612 and a second magnetic body 1614, the first magnetic body 1612 and the second magnetic body 1614 may be different types of magnetic bodies, and the second magnetic body 1614 may be disposed on a portion of a surface of the first magnetic body 1612. That is, unlike the embodiment of FIG. 11, the second magnetic body 1614 may be disposed only on an outer circumferential surface S2 and an inner circumferential surface S4 of the first magnetic body 1612. Here, the second magnetic body 1614 may have a higher saturation magnetic flux density than the first magnetic body 1612.

To this end, the second magnetic body 1614, which is a metal ribbon, may be wound around the outer circumferential surface S2 of the toroidal first magnetic body 1612. Further, the second magnetic body 1614, which is a metal ribbon pre-wound in a toroidal shape, may be inserted into a hollow of the first magnetic body 1612. The pre-wound second magnetic body 1614 may be unrolled to fit the size of the inner circumferential surface S4 of the first magnetic body 1612.

Accordingly, it is possible to dispose the second magnetic body 1614 on a portion of the surface of the first magnetic body 1612 by a simple process.

While the example embodiments of the present invention and their advantages have been described above in detail, it should be understood by those skilled in the art that various changes, substitutions and alterations may be made herein without departing from the scope of the invention as defined by the following claims.

DETAILED DESCRIPTION OF MAIN ELEMENTS

100: inductor
110: magnetic core
120: coil
1100: magnetic core
1110: sub-magnetic core
1112: first magnetic body
1114: second magnetic body

The invention claimed is:

1. An inductor comprising:
a magnetic core; and
a coil wound around the magnetic core,
wherein the magnetic core includes a plurality of stacked sub-magnetic cores,
each of the sub-magnetic cores includes a first magnetic body and a second magnetic body,
the first magnetic body and the second magnetic body are different types of magnetic bodies,
the second magnetic body is disposed on at least a portion of a surface of the first magnetic body,
each of the sub-magnetic cores has a toroidal shape, and
a permeability of the first magnetic body differs from a permeability of the second magnetic body,
wherein the first magnetic body includes ferrite and the second magnetic body includes a metal ribbon.

2. The inductor of claim 1, wherein a ratio of a thickness of the second magnetic body disposed on an outer circumferential surface of the first magnetic body in a radial direction of the first magnetic body to a thickness of the first magnetic body ranges from 1:16 to 1:80.

3. The inductor of claim 1, wherein a ratio of a thickness of the second magnetic body disposed on an inner circumferential surface of the first magnetic body in a radial direction of the first magnetic body to a thickness of the first magnetic body ranges from 1:16 to 1:80.

4. The inductor of claim 1, wherein the permeability of the second magnetic body is greater than the permeability of the first magnetic body.

5. The inductor of claim 1, wherein:
the magnetic core further includes a lower sub-magnetic core disposed on a lowermost sub-magnetic core of the plurality of sub-magnetic cores and an upper sub-magnetic core disposed on an uppermost sub-magnetic core of the plurality of sub-magnetic cores; and
the lower sub-magnetic core and the upper sub-magnetic core are made of a first magnetic body.

6. The inductor of claim 1, wherein the first magnetic body includes a Mn—Zn based ferrite and the second magnetic body includes an Fe—Si based metal ribbon.

7. The inductor of claim 1, wherein:
the first magnetic body has a toroidal shape; and
the second magnetic body is disposed to surround all of an upper surface, an outer circumferential surface, a lower surface, and an inner circumferential surface of the first magnetic body.

8. The inductor of claim 7, wherein the second magnetic body which surrounds at least one of the outer circumferential surface and the inner circumferential surface of the first magnetic body includes a metal ribbon in which a plurality of layers are wound.

9. The inductor of claim 8, wherein a total number of layers of the metal ribbon disposed in a region in which the coil is wound differs from a total number of layers of the metal ribbon disposed in a region in which the coil is not wound.

10. The inductor of claim 7, wherein:
each of a thickness of the second magnetic body disposed on the upper surface of the first magnetic body and a thickness of the second magnetic body disposed on the lower surface of the first magnetic body is smaller than a distance between the upper surface of the first magnetic body and the lower surface of the first magnetic body; and
each of a thickness of the second magnetic body disposed on the outer circumferential surface of the first magnetic body and a thickness of the second magnetic body disposed on the inner circumferential surface of the first magnetic body is smaller than a distance between the outer circumferential surface of the first magnetic body and the inner circumferential surface of the first magnetic body.

11. The inductor of claim 1, wherein:
the magnetic core has a toroidal shape;
the first magnetic body includes a first region in which the second magnetic body is disposed to surround an upper surface, an outer circumferential surface, a lower surface, and an inner circumferential surface of the first magnetic body and a second region in which the second magnetic body is not disposed; and
the coil is wound around a surface of the first region.

12. The inductor of claim 11, wherein the second region and the coil are spaced apart from each other.

13. The inductor of claim 11, wherein the first magnetic body includes a pair of first regions disposed symmetrically to each other and a pair of second regions disposed symmetrically to each other.

14. An electromagnetic interference (EMI) filter comprising:
at least one inductor; and
at least one capacitor,
wherein the inductor includes a magnetic core and a coil wound around the magnetic core,
the magnetic core includes a plurality of stacked sub-magnetic cores,
each of the sub-magnetic cores includes a first magnetic body and a second magnetic body,
the first magnetic body and the second magnetic body are different types of magnetic bodies,
the second magnetic body is disposed on at least a portion of a surface of the first magnetic body,
each of the sub-magnetic cores has a toroidal shape, and
a permeability of the first magnetic body differs from a permeability of the second magnetic body,
wherein the first magnetic body includes ferrite and the second magnetic body includes a metal ribbon.

15. A magnetic core comprising:
a first sub-magnetic core; and
a second sub-magnetic core stacked on the first sub-magnetic core,
wherein each of the first sub-magnetic core and the second sub-magnetic core includes a first magnetic body and a second magnetic body,
the first magnetic body and the second magnetic body are different types of magnetic bodies,
the second magnetic body is disposed on at least a portion of a surface of the first magnetic body,
each of the first sub-magnetic core and the second sub-magnetic core has a toroidal shape, and
a permeability of the first magnetic body differs from a permeability of the second magnetic body, wherein:
the first magnetic body has a toroidal shape; and the second magnetic body is disposed to surround at least one of an outer circumferential surface and an inner circumferential surface of the first magnetic body, wherein the second magnetic body which surrounds the at least one of the outer circumferential surface and the inner circumferential surface of the first magnetic body includes a metal ribbon in which a plurality of layers are wound.

16. The magnetic core of claim 15, wherein:

the second magnetic body is disposed to surround all of an upper surface, the outer circumferential surface, a lower surface, and the inner circumferential surface of the first magnetic body.

17. The magnetic core of claim 15, further comprising a lower sub-magnetic core disposed below the first sub-magnetic core and an upper sub-magnetic core disposed above the second sub-magnetic core, wherein the lower sub-magnetic core and the upper sub-magnetic core are made of a first magnetic body.

18. The magnetic core of claim 15, wherein:

the first magnetic body includes a first region in which the second magnetic body is disposed to surround an upper surface, an outer circumferential surface, a lower surface, and an inner circumferential surface of the first magnetic body and a second region in which the second magnetic body is not disposed.

19. An inductor comprising:

the magnetic core of claim 15; and a coil wound around the magnetic core.

20. An electromagnetic interference (EMI) filter comprising:

a capacitor; and the inductor of claim 19.

* * * * *